United States Patent [19]

Chen et al.

[11] Patent Number: 5,124,568
[45] Date of Patent: Jun. 23, 1992

[54] EDGE-TRIGGERED FLIP-FLOP

[75] Inventors: Kou-Su Chen, Fremont; Sai-Keung Lee, Milpitas, both of Calif.

[73] Assignee: Advanced Micro Devices, Inc., Sunnyvale, Calif.

[21] Appl. No.: 655,685

[22] Filed: Feb. 14, 1991

[51] Int. Cl.[5] ............................................. H03K 5/00
[52] U.S. Cl. ................................. 307/243; 307/272.1;
307/289; 307/291; 307/445
[58] Field of Search ...................... 307/243, 269, 272.1,
307/279, 289, 291, 445, 480

[56] References Cited
U.S. PATENT DOCUMENTS 4,224,533  8/1980  Lai .................................... 307/243 X
4,980,577  12/1990  Baxter ............................. 307/291 X

OTHER PUBLICATIONS

PAL® Device Data Book for AT&T, Advanced Micro Devices, 1988, pp. v–xii, 3–23, 5–23, 5–90, 5–110, 5–112, 5–236.
Richard J. Higgins, Electronics with Digital and Analog Integrated Circuits, 1983, pp. 107–131, 185–196.

Primary Examiner—Robert J. Pascal
Attorney, Agent, or Firm—Skjerven, Morrill, MacPherson, Franklin & Friel

[57] ABSTRACT

A simple edge-triggered flip-flop is provided that does not require a clock or a master-slave structure. In some embodiments, the flip-flop has multiple set, reset and/or trigger (T) inputs.

29 Claims, 8 Drawing Sheets

EDGE-TRIGGERED FLIP-FLOP

BACKGROUND OF THE INVENTION

1. Field of the Invention

This invention relates to multiple state devices, and more particularly to edge-triggered flip-flops.

2. Description of Related Art

Flip-flops are widely used in electronic circuits. See, for example, Richard J. Higgins, *Electronics with Digital and Analog Integrated Circuits* 107-131 (Prentice-Hall, 1983); *PAL ® Device Data Book for AT&T* (Advanced Micro Devices, 1988). Edge-sensitive flip-flops are often preferred because, among other things, of their reduced sensitivity to noise.

SUMMARY OF THE INVENTION

An edge-triggered flip-flop is provided. In some embodiments, the flip-flop has multiple set (S), reset (R) and trigger (T) inputs. Such a flip-flop is set on an edge of any set input, is reset on an edge of any reset input, and toggled on an edge of any trigger input. If, for example, the flip-flop is reset on a rising edge of a reset input R0, the flip-flop can be set, reset or toggled by other set, reset and trigger inputs between the rising edges of reset input R0. As soon as the flip-flop is reset on a rising edge of reset input R0, the flip-flop becomes "insensitive" to reset input R0 until the next rising edge thereof. This functionality is achieved by simple circuitry without a clock or a master-slave structure.

Some embodiments are provided with a level-sensitive asynchronous set and clear and with a level-sensitive asynchronous initialization.

The flip-flop according to this invention has a first node and means for setting a state of the flip-flop in accordance with the state of the first node. At least one first terminal is provided, such as a set or a reset terminal in some embodiments. At least one first causing means is provided for selectively causing the flip-flop to assume its first state. Each first causing means comprises a first driving means for selectively driving the first node. The first driving means has a first input and a second input. The first driving means is inactive to drive the first node when at least one of the first and second inputs of the first driving means is in its respective first state. The first driving means drives the first node to its first state when the first and second inputs of the first driving means are in their respective second states.

The first causing means further comprises a first state means having a first and a second input. The first state means comprises an output coupled to the second input of the first driving means. The first state means drives its output to its first state when the first input of the first state means is in its first state and the second input of the first state means is in its second state. The first state means drives its output to its second state when the first input of the first state means is in its second state and the second input of the first state means undergoes a transition from its first state to its second state. The state of the output of the first state means remains unchanged when the second input of the first state means is in its second state and the first input of the first state means undergoes a transition from its first state to its second state. The first input of the first driving means and the second input of the first state means are coupled to one of the first terminals. The first inputs of all the first state means are coupled to the first node.

In one embodiment, the first driving means comprises two N-channel MOSFETs coupled in series between the first node and ground. The first and second inputs of the first driving means are coupled to the respective gates of the two MOSFETs. The first state means of that embodiment comprises an S-R flip-flop having a set input coupled to the first terminal and a reset input coupled to the first node. The S-R flip-flop is built of NAND gates.

Other features and advantages of the invention are described below.

DESCRIPTION OF THE PREFERRED EMBODIMENTS

Figure 1:
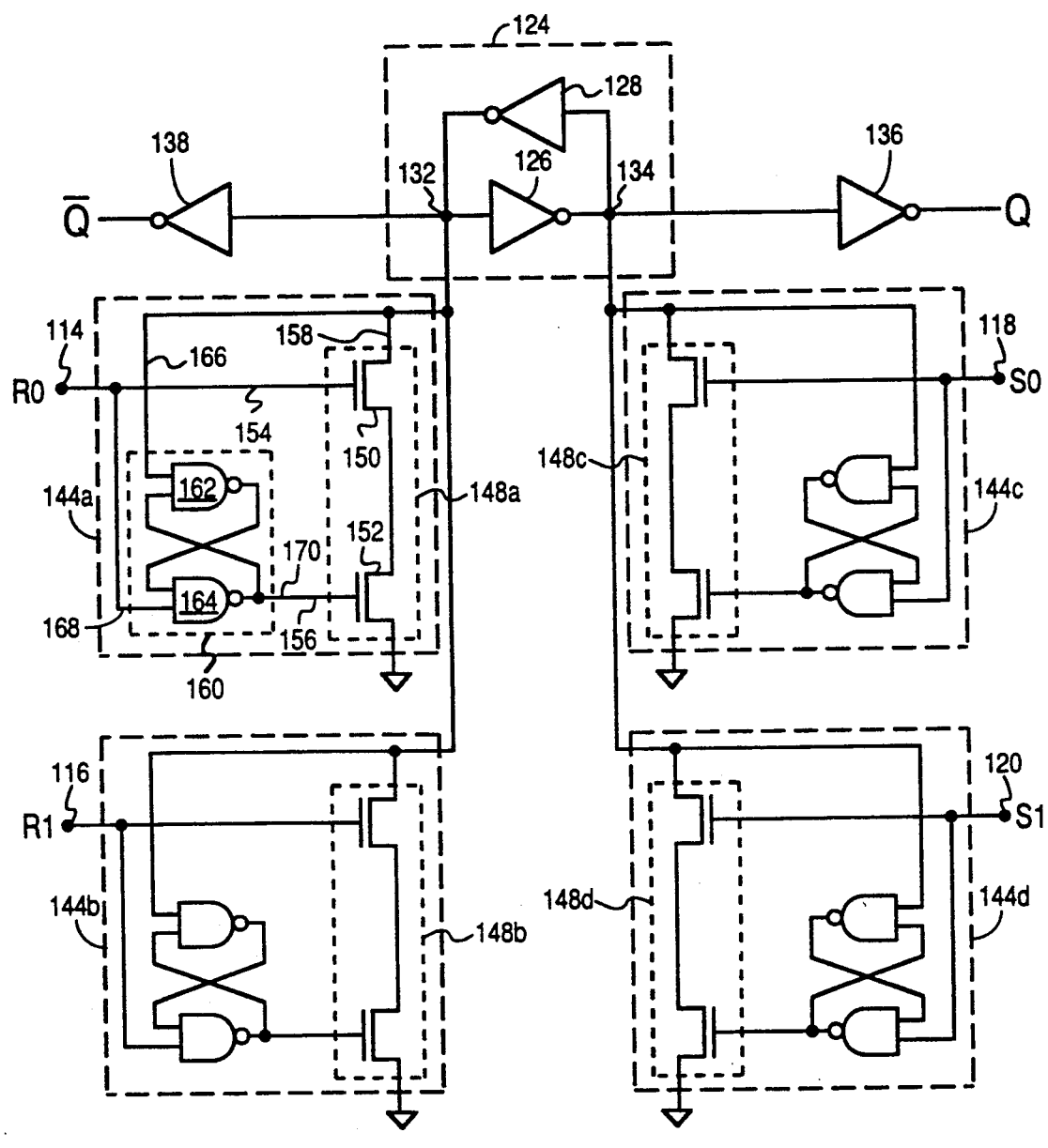
FIG. 1 is a circuit diagram of an edge-triggered flip-flop according to this invention.

FIG. 1 is a circuit diagram of a multiple edge S-R flip-flop 110. Flip-flop 110 has an output Q which can be a high voltage level (state 1) or a low voltage level (state 0). In this description, a high voltage level of a two-state signal, node or terminal is termed "state 1", and a low voltage level is termed "state 0". Of course, state designations 1 and 0 are interchangeable. Flip-flop 110 has a complementary output $\overline{Q}$. When output Q is high, flip-flop 110 is said to be in state 1. When output Q is low, flip-flop 110 is said to be in state 0.

Flip-flop 110 has a reset input terminal 114 for receiving a reset signal R0, a reset input terminal 116 for receiving a reset signal R1, a set input terminal 118 for receiving a set signal S0, and a set input terminal 120 for receiving a set signal S1. On a rising edge of reset signal R0, flip-flop 110 is reset. That is, when reset input terminal 114 undergoes a transition from a low level to a high level, flip-flop 110 assumes state 0. Similarly, flip-flop 110 is reset on a rising edge of reset signal R1. Flip-flop 110 is set, i.e. assumes state 1, on a rising edge of set signal S0. Similarly, flip-flop 110 is set on a rising edge of set signal S1.

Flip-flop 110 has a data latch 124 comprising cross-coupled inverters 126 and 128. A node 132 is coupled to the input of inverter 126 and the output of inverter 128. A node 134 is coupled to the input of inverter 128 and the output of inverter 126. Node 134 is coupled to flip-flop output Q through an inverter 136. Node 132 is coupled to complementary output $\overline{Q}$ through an inverter 138. When node 132 is low, node 134 is high and flip-flop output Q is low; flip-flop 110 is in state 0. When node 134 is low, node 132 is high and flip-flop output Q is high; flip-flop 110 is in state 1.

Node 132 is connected to reset input terminal 114 through an edge-sensitive cell 144a. Node 132 is connected to reset input terminal 116 through an edge-sensitive cell 144b. Node 134 is connected to set input terminals 118 and 120 through respective edge-sensitive cells 144c and 144d. Edge-sensitive cells 144 are similar to each other and will be described on the example of edge-sensitive cell 144a.

Edge-sensitive cell 144a comprises a circuit 148a which in turn comprises N-channel MOSFETs 150 and 152 coupled in series between node 132 and ground. The ground serves as a source of power. Circuit 148a has a first input 154 coupled to the gate of transistor 150 and to reset input terminal 114, a second input 156 coupled to the gate of transistor 152, and an output 158 coupled to the drain of transistor 150 and to node 132. When the gates of transistors 150 and 152 are high, transistors 150 and 152 conduct, and circuit 148a drives node 132 low (to 0). When at least one of the gates of transistors 150 and 152 is low, the respective transistor 150 or 152 is off, and circuit 148a is inactive to drive node 132. That is, the state of node 132 is determined entirely by other signals.

Edge-sensitive cell 144a includes an S-R flip-flop 160 built of cross-coupled NAND gates 162 and 164. S-R flip-flop 160 has a reset input 166 coupled to node 132, a set input 168 coupled to reset input terminal 114, and an output 170 coupled through input 156 to the gate of transistor 152.

Edge-sensitive cell 144a operates as follows. When reset signal R0 is low, transistor 150 is off, and circuit 144a presents a high impedance to (is inactive to drive) node 132. At a low-to-high transition of reset signal R0, transistor 150 turns on. The state of output 170 of flip-flop 160 is determined by the state of its reset input 166 and reset signal R0 immediately before the transition. The state of reset input 166 is determined by the state of flip-flop 110. If, before the transition, flip-flop 110 is reset, node 132 is at 0. Reset input 166 is 0, and output 170 of flip-flop 160 after the transition is 0. Transistor 152 is off, circuit 148a presents a high impedance to node 132, and flip-flop 110 remains reset. If, before the transition, flip-flop 110 is set, node 132 is 1. Reset input 166 is also 1. Immediately after the transition, output 170 of flip-flop 160 is 1. Transistor 152, like transistor 150, is on. Circuit 148a then drives node 132 to 0 thereby resetting flip-flop 110. Reset input 166, coupled to node 132, is also driven to 0, while reset signal R0 remains 1. Output 170 of flip-flop 160 becomes 0, turning off transistor 152. Circuit 148a then presents a high impedance to node 132. Flip-flop 110 can then be set and reset by signals S0, S1 and R1. As long as reset signal R0 remains 1, any change of state of node 132 does not affect output 170 of flip-flop 160, and output 170 remains 0. And when reset signal R0 returns to state 0, transistor 150 turns off, and circuit 148a remains high impedance. On a falling edge of reset signal R0, transistor 150 turns off before transistor 152 turns on. This timing is achieved by setting the parameters of transistors 150 and 152 and of NAND gates 162 and 164 using methods well known in the art.

Thus on a rising edge of reset signal R0, as soon as flip-flop 110 is reset, flip-flop 110 becomes insensitive to reset signal R0. The "window of sensitivity" of flip-flop 110 to reset signal R0 closes automatically when flip-flop 110 is reset. No external clock or other circuit is needed to regulate the window. Until the next rising edge of reset signal R0, flip-flop 110 can be set and reset by signals S0, S1 and R1.

Edge-sensitive cell 148b operates similarly to drive node 132 to 0 on a rising edge of reset signal R1. Similarly, edge sensitive cell 148c drives node 134 to 0, and thus sets flip-flop 110, on a rising edge of set signal S0. Edge-sensitive cell 148d similarly drives node 134 to 0 on a rising edge of set signal S1.

Figure 2:
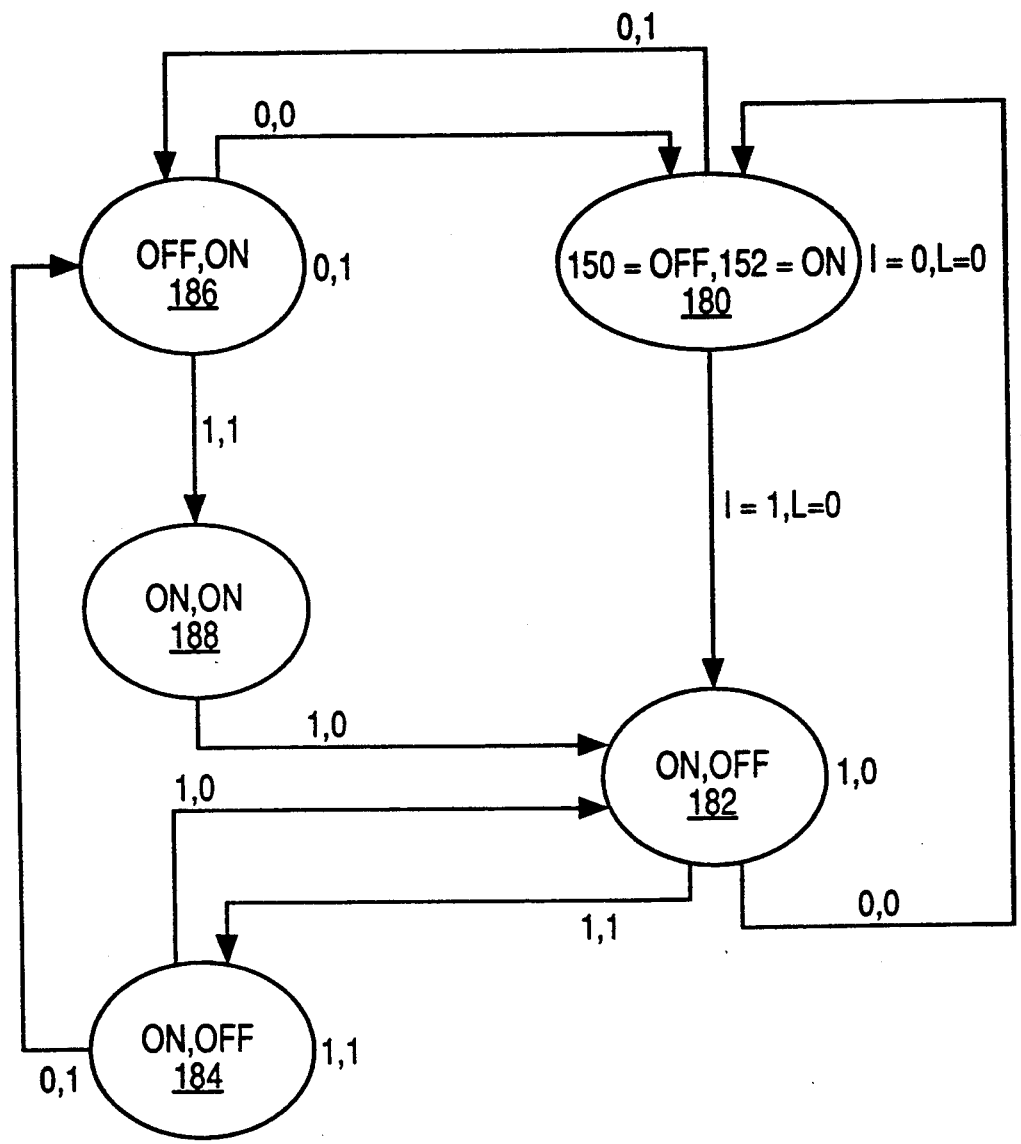
FIG. 2 is a state transition diagram representing an edge-sensitive cell of an edge-triggered flip-flop of this invention

In FIG. 2, edge-sensitive cell 144a is represented by a state transition diagram showing the states of circuit 148a in response to reset signal R0 (denoted by I in FIG. 2) and the state of latch 124. The state of latch 124, denoted by L in FIG. 2, is the state of node 132. L-complement is the state of node 134. When I=0 and L=0, circuit 148a is in state 180. Transistor 150 is off, and transistor 152 is on. State 180 is an OFF state, that is circuit 148a presents a high impedance. On the transition of input I from 0 to 1, circuit 148a enters an OFF state 182. Transistor 150 is on, and transistor 152 is off. In the circuit of FIG. 1, the OFF state 182 is actually entered through a transitory ON state (not shown) in which both transistors 150 and 152 are on. The transitory ON state occurs because transistor 150 turns on before transistor 152 turns off. The transitory ON state has no effect since L is 0.

On a transition of L from 0 to 1, circuit 148a enters an OFF state 184. When L returns to 0, circuit 148a returns to state 182. If, in state 182, I returns to 0, circuit 148a returns to state 180.

When I=0 and L=1, circuit 148a is in an OFF state 186. Transistor 150 is off, and transistor 152 is on. On the transition of I from 0 to 1, circuit 148a enters an ON state 188. Transistors 150 and 152 are on. State 188 is a transitory state. In that state, circuit 148a drives L to 0 and, consequently, enters OFF state 182.

Every edge-sensitive cell 144 can be represented by the state transition diagram of FIG. 2.

When a set and a reset occur simultaneously, flip-flop 110 changes states (toggles). For example, when reset signal R0 and set signal S0 undergo a low-to-high transition simultaneously, flip-flop 110 toggles. Indeed, if, for example, flip-flop 110 is in state 0 before the transitions, node 132 is 0. Immediately after the transitions, output of flip-flop 160 is 0, and circuit 148a presents a high impedance. Circuit 148c, however, drives node 134 to 0 and flip-flop 110 to 1. Flip-flop 110 toggles. A similar analysis shows that flip-flop 110 toggles if it is in state 1 before the transitions.

As described above, flip-flop 110 has two reset input terminals 114 and 116 and two set input terminals 118 and 120. Variations of flip-flop 110 have other numbers of set and reset input terminals. For example, one variation has five reset input terminals and three set input terminals. Some variations have only one reset input terminal or only one set input terminal. Some variations have no reset input terminals, but only one or more set input terminals. Some variations have no set input terminals, but only one or more reset input terminals.

In some variations, flip-flop 110 is sensitive to a falling, as opposed to rising, edge of some or all set and reset signals. In other variations, flip-flop 110 is sensitive to both rising and falling edges of some or all set and reset signals Data latch 124 is replaced by other types of data latches in some variations. Inverters 136 and 138 are optional.

Figure 3:
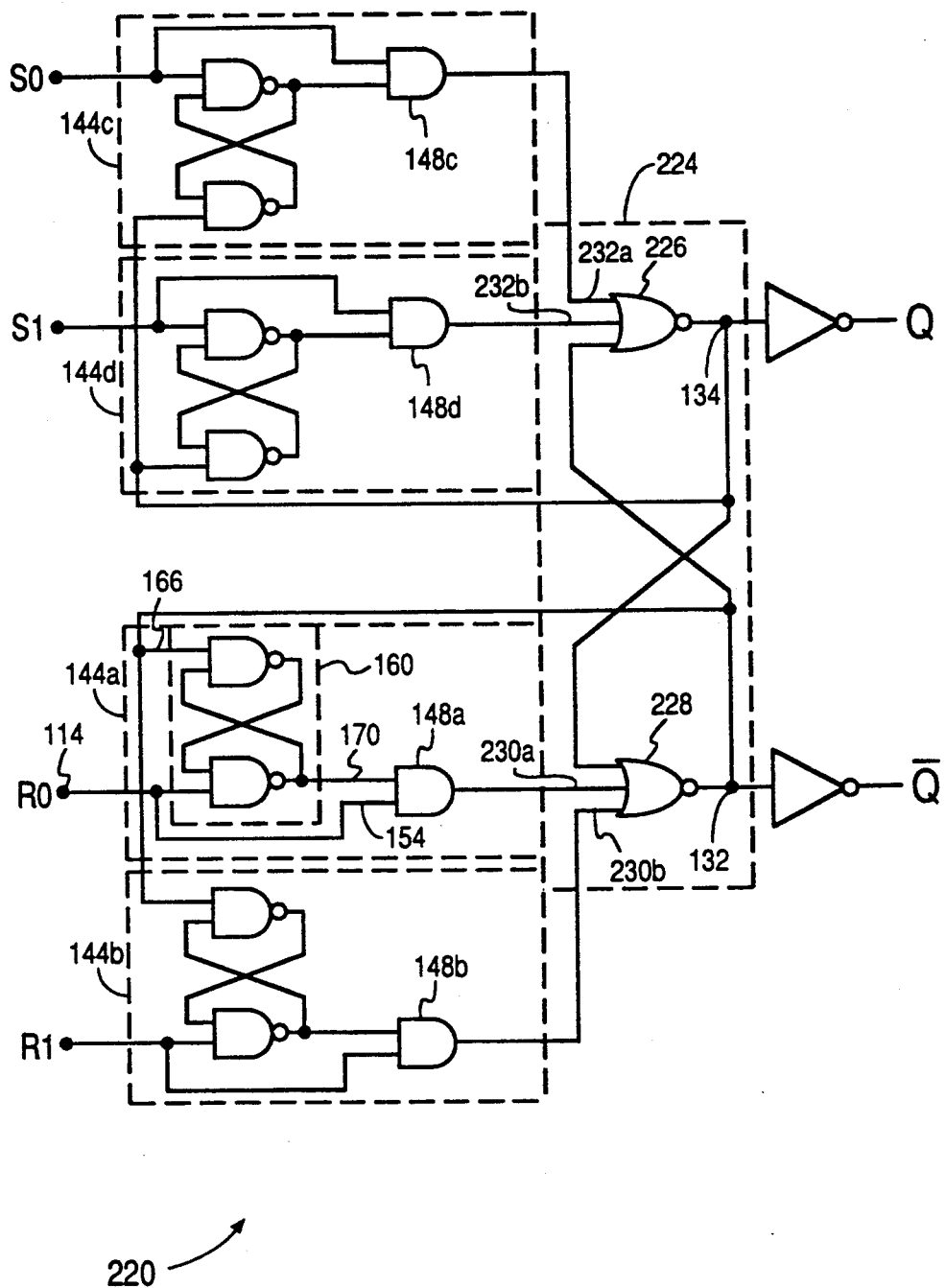
FIGS. 3-5 are circuit diagrams of edge-triggered flip-flops according to this invention.

FIG. 3 is a circuit diagram of a multiple edge S-R flip-flop 220 built entirely of logic gates and inverters. S-R flip-flop 224 built of cross-coupled NOR gates 226 and 228 replaces data latch 124 of FIG. 1. Node 132 is coupled to the output of NOR gate 228. Node 134 is coupled to the output of NOR gate 226. Inputs 230a and 230b of NOR gate 228 serve as reset inputs of flip-flop 224. Inputs 232a and 232b of NOR gate 226 serve as set inputs of flip-flop 224. Circuit 148a of edge-sensitive cell 144a is an AND gate having input 154 coupled to reset input terminal 114, having another input coupled to output 170 of S-R flip-flop 160, and having an output coupled to input 230a of NOR gate 228. The output of circuit 148b of edge-sensitive cell 144b is coupled to input 230b of NOR gate 228. Edge-sensitive cells 144c and 144d are similar to edge-sensitive cells 144a and 144b. The outputs of circuits 148c and 148d of respective cells 144c and 144d are coupled to respective inputs 232a and 232b of NOR gate 226.

Edge-sensitive cell 144a operates as follows. When reset signal R0 is low, the output of gate 148a is 0, and gate 148a is inactive to drive node 132. After a low-to-high transition of reset signal R0, the state of the output of gate 148a is determined by the state of output 170 of flip-flop 160. The state of output 170 is determined by the state of reset input 166 of flip-flop 160 immediately before the transition. The state of reset input 166 is determined by the state of flip-flop 220. If, before the transition, flip-flop 220 is reset, node 132 is 0. Reset input 166 is 0, and output 170 after the transition is 0. Gate 148a remains inactive to drive node 132. Flip-flop 220 remains reset. If, before the low-to-high transition of reset signal R0, flip-flop 220 is set, node 132 is 1. Reset input 166 is also 1. Output 170 of flip-flop 160 is 1, and remains 1 immediately after the transition. The output of gate 148a is 1; hence, node 132 is driven to 0 after the transition. Assuming that set signals S0 and S1 are low, flip-flop 220 is reset. Since node 132 is coupled to reset input 166 of flip-flop 160, flip-flop 160 is also reset, and its output 170 becomes 0. Gate 148a becomes inactive to drive node 1. Flip-flop 220 can then be set and reset by signals S0, S1 and R1 until the next rising edge of reset signal R0.

Edge-sensitive cell 144a can be represented by the state transition diagram of FIG. 2. In OFF states 180, 182, 184 and 186, gate 148a is inactive to drive node 132. In transitory ON state 188, gate 148a drives node 132 to 0.

Edge-sensitive cells 144b, 144c and 144d of flip-flop 220 are similar to edge-sensitive cell 144a.

When a set and a reset occur simultaneously, flip-flop 220 toggles. This can be seen from analysis similar to the analysis given above in connection with flip-flop 110.

Some variations of flip-flop 220, like variations of flip-flop 110, have other numbers of set input terminals and other numbers of reset input terminals. In some variations, the number of set input terminals is different from the number of reset input terminals. Some variations have only set input terminals or only reset input terminals.

Figure 4:
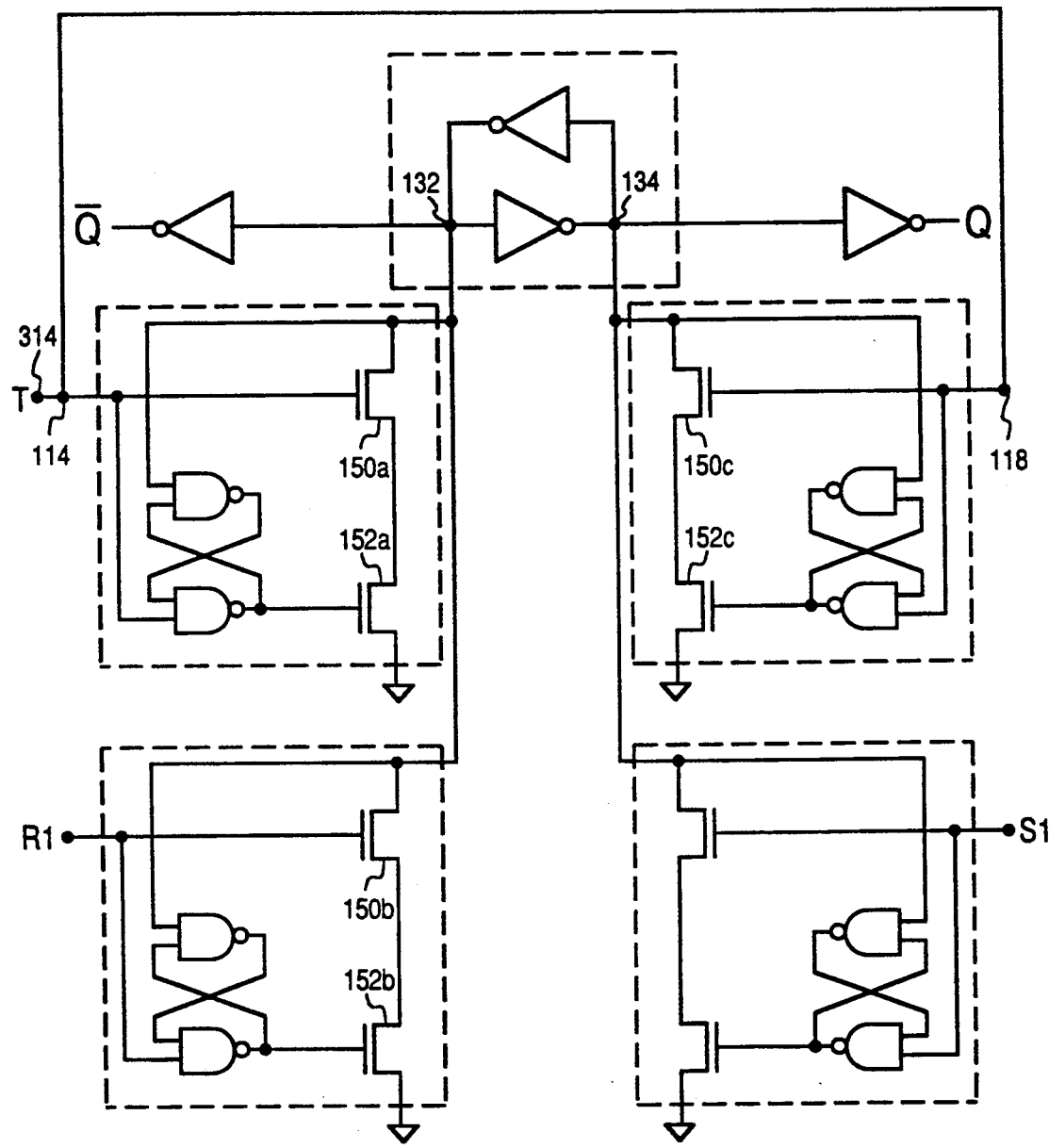

Flip-flop 310 of FIG. 4 is a combination S-R and T flip-flop. Flip-flop 310 is obtained from flip-flop 110 of FIG. 1 if reset input terminal 114 of FIG. 1 is coupled to set input terminal 118 and that pair of input terminals is coupled to a trigger input terminal 314 for receiving a trigger signal T. On a rising edge of trigger signal T, flip-flop 310 toggles. Indeed, a rising edge of trigger signal T is equivalent to simultaneous rising edges of reset signal R0 and set signal S0 in flip-flop 110. As can be seen from analysis similar to the analysis given above for flip-flop 110, flip-flop 310 toggles.

When node 132 is 0 and trigger signal T undergoes a transition from 0 to 1, transistor 150a may turn on before transistor 152a turns off. For a short period of time, transistors 150a and 152a are both on pulling node 132 down to 0. At the same time, transistors 150c and 152c pull node 134 down to 0. This race condition exists only until transistor 152a turns off, and thus has no detrimental effect in many applications. A similar race condition exists on a rising edge of trigger signal T when node 134 is 0.

Figure 5:
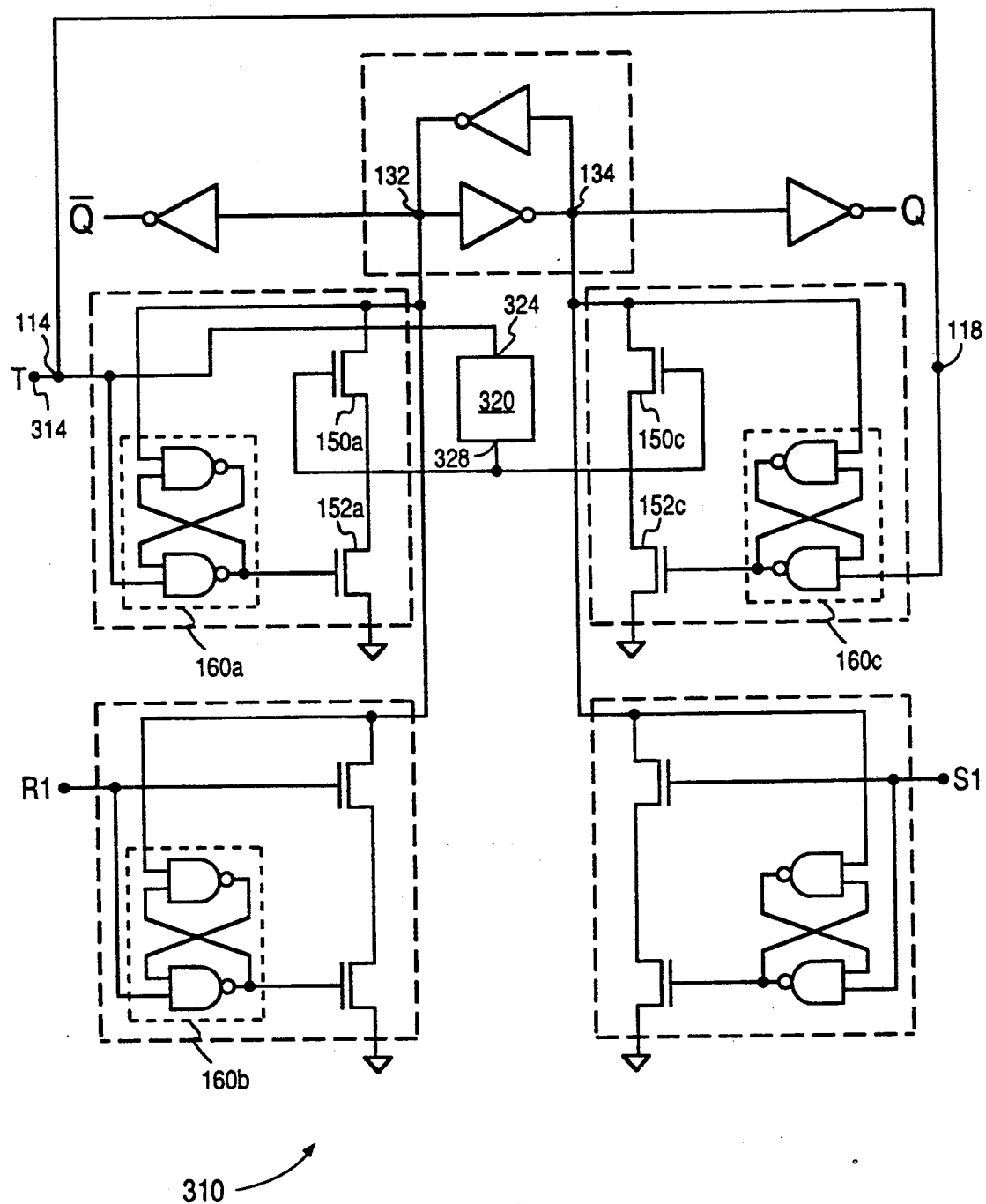

The race is eliminated, however, in flip-flop 310 of FIG. 5. Here trigger input terminal 314 is coupled to the gates of transistors 150a and 150c through a delaying circuit 320 whose input 324 is coupled to trigger input terminal 314 and whose output 328 is coupled to the gates of transistors 150a and 150c. Due to the delay introduced by delaying circuit 320, when node 132 is 0 on a rising edge of trigger signal T, transistor 150a turns on after transistor 152a turns off. Likewise, when node 134 is 0 on a rising edge of trigger signal T, transistor 150c turns on after transistor 152c turns off.

Delaying circuit 320 is edge-sensitive so that on a falling edge of trigger signal T, transistors 150a and 150c turn off before transistors 152a and 152c turn on. On a rising edge of trigger signal T, the delay of delaying circuit 320 is larger than the delay through flip-flops 160. On a falling edge of trigger signal T, the delay of delaying circuit 320 is smaller than the delay through flip-flops 160.

Figure 6:
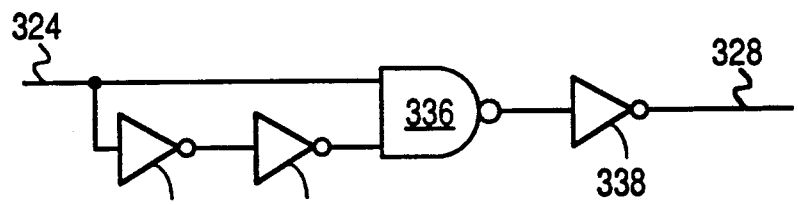
FIGS. 6 and 7 are circuit diagrams of embodiments of a delaying circuit of the flip-flop of FIG. 5.

FIG. 6 shows a circuit diagram of one embodiment of delaying circuit 320. On a rising edge of input 324, output 328 becomes high only after the high state of input 324 propagates through inverters 332a and 332b, NAND gate 336 and inverter 338. On a falling edge of input 324, output 328 becomes low after the delay through NAND gate 336 and inverter 338 only. The circuit parameters are selected so that, on a rising edge of trigger signal T, the delay through inverters 332, NAND gate 336 and inverter 338 is larger than the delay through flip-flops 160, while on a falling edge of trigger signal T the delay through NAND gate 336 and inverter 338 is smaller than the delay through flip-flops 160.

In some variations, four, six, or other even number of inverters coupled in series are used instead of inverters 332.

Conventional resistor-capacitor networks are used in some variations to adjust the delays through delaying circuit 320 of FIG. 6. For example, in one variation, a resistor is connected in series between inverters 332a and 332b and a capacitor is connected between the input of inverter 332b and ground to adjust the delay of delaying circuit 320 by the corresponding RC value.

Figure 7:
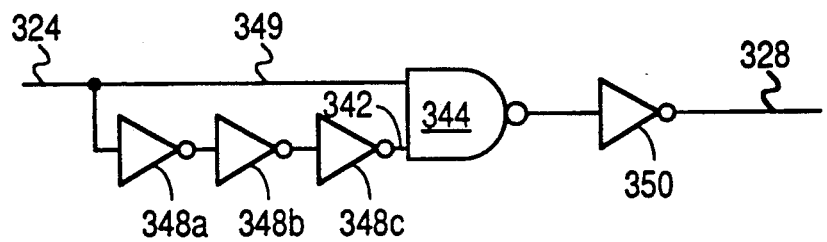
Figure 8:
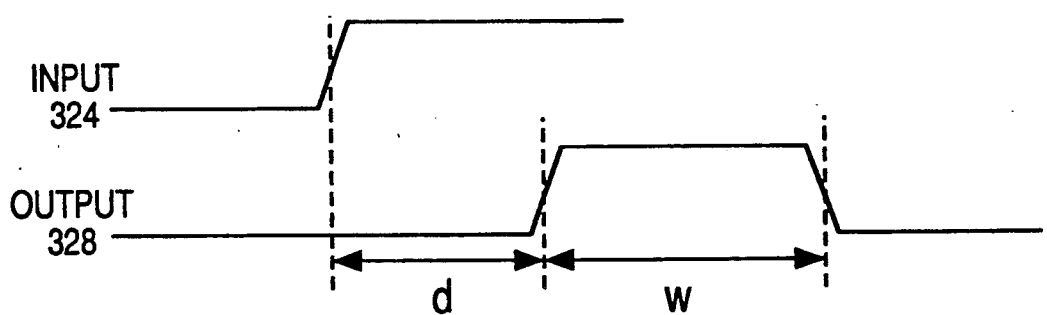
FIG. 8 is a diagram of input and output signals of the delaying circuit of FIG. 7.

In one embodiment, delaying circuit 320 is a monostable multivibrator such as shown in FIG. 7. On a rising edge of input 324, input 342 of NAND gate 344 remains high until the high state of input 324 propagates through inverters 348a, 348b and 348c. Input 349 of NAND gate 344 rises immediately with input 324. After a delay d during which the high state of input 349 propagates through NAND gate 344 and inverter 350, output 328 rises. See FIG. 8 showing the diagrams of the signals on input 324 and output 328. When the high state of input 324 propagates through inverters 348, NAND gate 344 and inverter 350, output 328 falls back to 0. Output 328 remains at 0 until the next rising edge of input 324. The width w of the pulse of output 328 is sufficient to drive node 132 or node 134 from 1 to 0 through respective transistors 150 and 152.

Other monostable multivibrators are used in other variations. Other odd number of inverters are provided in series instead of inverters 348 in some variations. Resistor-capacitor networks are used in some variations to adjust the delays. On monostable multivibrators see generally Richard J. Higgins, *Electronics with Digital and Analog Integrated Circuits*, 185–196 (Prentice-Hall, 1983) hereby incorporated by reference herein.

In some variations, one delaying circuit is coupled between trigger input terminal T and the gate of transistor 150a and another delaying circuit is coupled between trigger input terminal T and the gate of transistor 150c.

In some variations of flip-flops 310 of FIGS. 4 and 5, more than one pair of a reset input terminal and a set input terminal is coupled to each other and to a trigger input terminal. Flip-flop 310 has then more than one trigger input terminal, and flip-flop 310 toggles on a rising edge of a signal on any one of the trigger input terminals. In some embodiments, every set input terminal and every reset input terminal is coupled to a trigger input terminal. Flip-flop 310 is then a multiple edge T flip-flop. Variations of flip-flop 310 may have any number of set, reset and trigger input terminals.

In another embodiment, flip-flop 310 is built on the basis of flip-flop 220 of FIG. 3. That is, at least one pair of a set input terminal and a reset input terminal of flip-flop 220 are coupled to each other and to a trigger input terminal. In some variations, a delaying circuit such as delaying circuit 320 is coupled between a trigger input terminal and respective inputs 154 of respective gates 148.

Some circuits use both flip-flop 110 of FIG. 1 and flip-flop 310 of FIG. 4. The same signal is used as reset signal R0 or set signal S0 in flip-flop 110 and as trigger signal T in flip-flop 310. Since flip-flops 110 and 310 have a similar construction, the skew between flip-flop 110 and flip-flop 310 on an edge of that signal is minimized which is advantageous in some applications. Similarly, in circuits using flip-flop 220 and a variation of flip-flop 310 built on the basis of flip-flop 220, the skew between flip-flop 220 and flip-flop 310 is minimized.

If flip-flop 310 of FIG. 5 is used with flip-flop 110 or flip-flop 220, the respective flip-flop 110 or 220 is provided with one or more delaying circuits as needed between a set or reset input terminal and input 154 of respective circuit 148 to minimize the skew between flip-flop 310 and the respective flip-flop 110 or 220.

In some variations of flip-flop 310 of FIG. 4, a programmable element is coupled between reset input terminal 114 and set input terminal 118. Such programmable elements are well known in the art of programmable read only memories ("PROMs"), erasable programmable read only memories ("EPROMs") and electrically erasable programmable read only memories ("EEPROMs"). Such programmable elements include fuses, antifuses, floating gate transistors and other programmable devices. In an unprogrammed state, a programmable element such as a fuse disconnects reset input terminal 114 from set input terminal 118. Reset input terminal 114 then provides reset signal R0, and set input terminal 118 provides set signal S0. No trigger signal is provided. When the fuse is programmed, reset input terminal 114 is coupled to set input terminal 118, and trigger input terminal 314 provides trigger signal T. Some variations of flip-flop 310 of FIG. 4 are user programmable to provide the user with a wide range of options as to the number of set, reset and trigger input terminals.

Some variations of flip-flop 310 of FIG. 5 are also provided with programmable elements to programmably connect set input terminals such as terminal 118 to reset input terminals such as terminal 114. Further, circuitry with programmable elements is provided to programmably bypass delaying circuit 320. Thus, when reset input terminal 114 is disconnected from set input terminal 118, that programmable circuitry is programmed so as to connect reset input terminal 114 directly to the gate of transistor 150a and to connect set input terminal 118 directly to the gate of transistor 150c. When reset input terminal 114 is programmed to be connected to set input terminal 118, that circuitry is programmed to connect trigger input terminal 314 to the gates of transistors 150a and 150c through delaying circuit 320 essentially as shown in FIG. 5. Those skilled in the art can construct such a programmable circuitry without undue experimentation in view of the above disclosure.

Further, programmable elements are used in some variations to programmably vary the delays and the pulse width w provided by respective delaying circuits 320 illustrated by FIGS. 6–8 and other such delaying circuits. Such use of programmable elements does not require undue experimentation from those skilled in the art.

Figure 9:
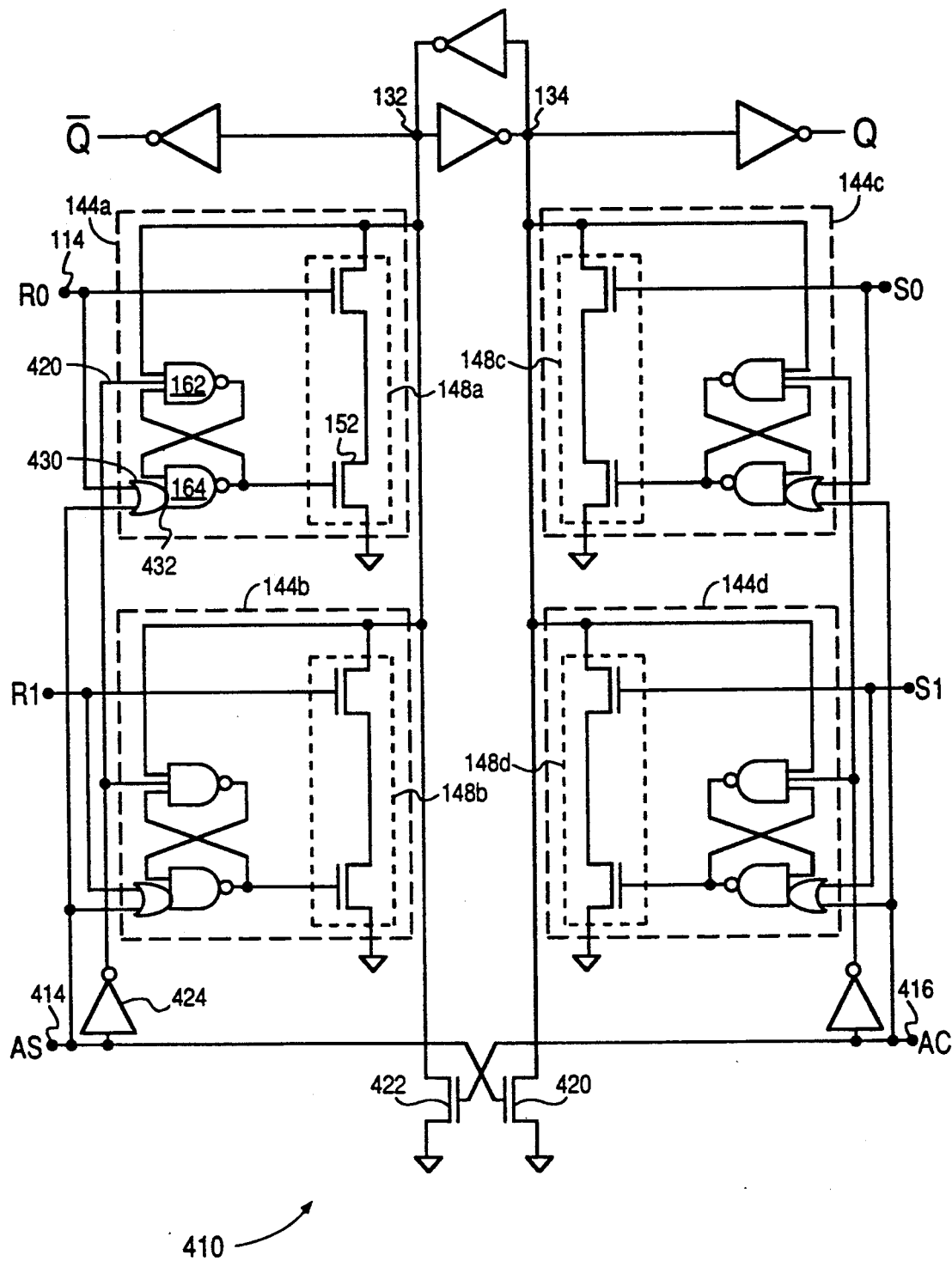
FIGS. 9 and 10 are circuit diagrams of edge-triggered flip-flops according to this invention.

FIG. 9 is a circuit diagram of a multiple edge S-R flip-flop 410 provided with a level-sensitive asynchronous set and clear. Flip-flop 410 is similar to flip-flop 110 of FIG. 1. Flip-flop 410 has an asynchronous set input terminal 414 for receiving an asynchronous set signal AS, and an asynchronous clear input terminal 416 for receiving an asynchronous clear signal AC. Asynchronous set input terminal 414 is coupled to the gate of an N-channel MOSFET 420 whose drain is coupled to node 134 and whose source is coupled to ground. Asynchronous clear input terminal 416 is coupled to the gate of an N-channel MOSFET 422 whose drain is coupled to node 132 and whose source is coupled to ground. When asynchronous set signal AS is high, transistor 420 conducts and drives node 134 to 0. Flip-flop 410 is thereby set. When asynchronous clear signal AC is high, transistor 422 conducts and drives node 132 to 0. Flip-flop 410 is reset. Additional circuitry is used in some embodiments to ensure that asynchronous set signal AS and asynchronous clear signal AC are not high simultaneously.

Edge-sensitive cells 144 are modified so that set and reset signals S0, S1, R0 and R1 do not affect the state of flip-flop 410 when asynchronous set signal AS or asynchronous clear signal AC is high. Edge-sensitive cells 144 are similar, and their operation will be described on the example of edge-sensitive cell 144a.

Edge-sensitive cell 144a includes cross-coupled NAND gates 162 and 164. NAND gate 162 has three inputs. Its input 420 is coupled through an inverter 424 to asynchronous set input terminal 414. Asynchronous set input terminal 414 and reset input terminal 114 are coupled to respective inputs of an OR gate 430 whose output is coupled to an input 432 of NAND gate 164. In all other respects, NAND gates 162 and 164 are connected as in flip-flop 110 of FIG. 1.

When asynchronous set signal AS is low, OR gate 430 provides, on its output, reset signal R0. Input 420 of NAND gate 162 is 1. NAND gates 162 and 164, and the whole cell 144a, then function as in FIG. 1. When asynchronous set signal AS is high, input 420 of NAND gate 162 is 0 and input 432 of NAND gate 164 is 1. The output of NAND gate 164 is therefore 0. Transistor 152 is off, and circuit 148a presents a high impedance to node 132.

Similarly, circuit 148b of edge-sensitive cell 144b presents a high impedance to node 132 when asynchronous set signal AS is high.

Similar analysis shows that, when asynchronous clear signal AC is high, circuit 148c of edge-sensitive cell 144c and circuit 148d of edge-sensitive cell 144d each present a high impedance to node 134.

Some variations of flip-flop 220 of FIG. 3 and flip-flops 310 of FIGS. 4 and 5 are also provided with a level-sensitive asynchronous set and clear using the circuitry similar to the circuitry of flip-flop 410. Some variations of flip-flops 110, 220, 310 and 410 are provided with an asynchronous set or with an asynchronous clear, but not with both.

Figure 10:
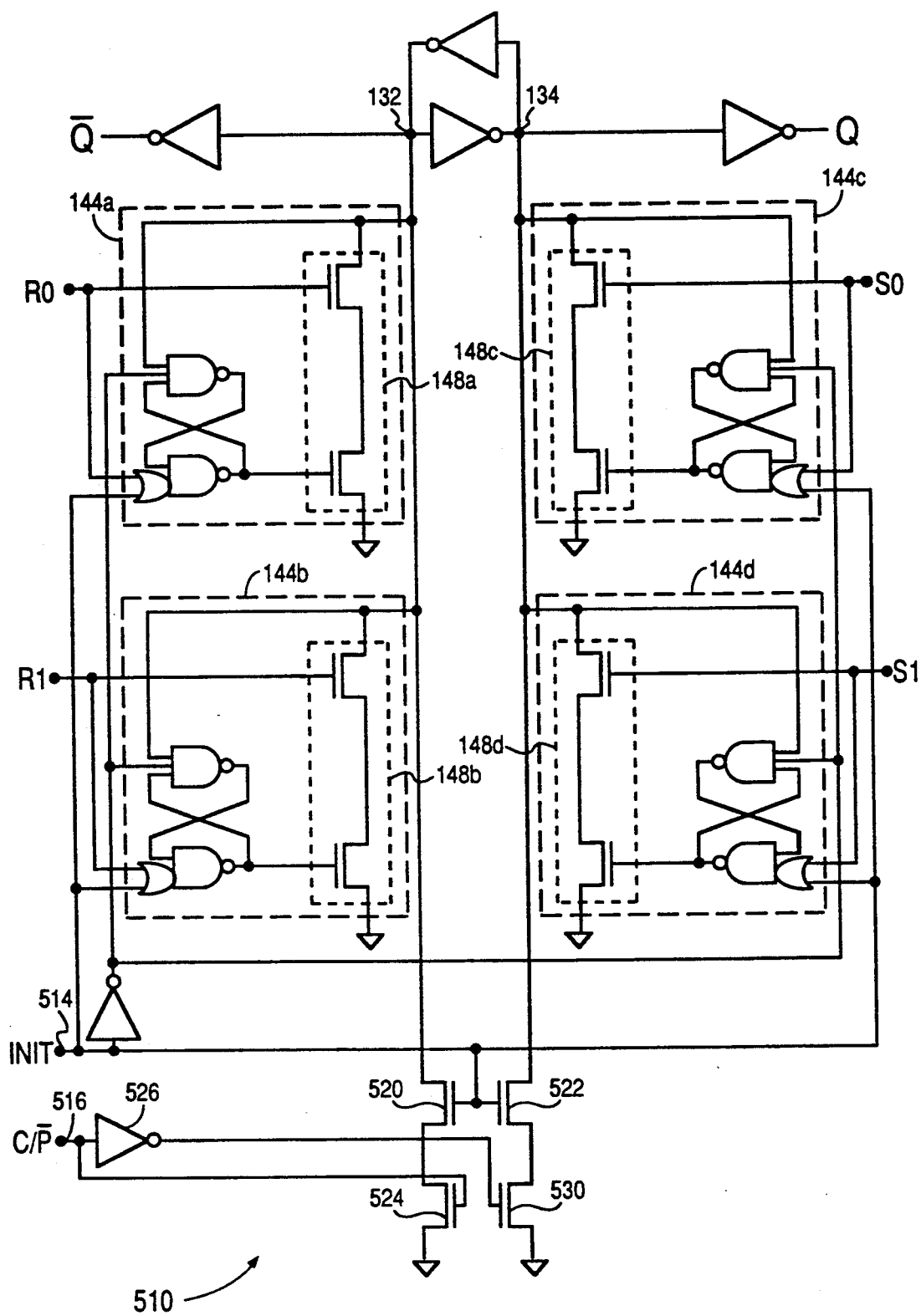

FIG. 10 is a circuit diagram of a multiple edge flip-flop 510 provided with a level-sensitive asynchronous initialization. Flip-flop 510 has an asynchronous initialize input terminal 514 for receiving an asynchronous initialize signal INIT, and a clear/preset input terminal 516 for receiving a clear/preset signal C/$\overline{P}$. When initialize signal INIT is high, flip-flop 510 is driven to state 0 or 1 depending on clear/preset signal C/$\overline{P}$. Initialize input terminal 514 is coupled to the gates of N-channel MOSFETs 520 and 522. Clear/preset input terminal 516 is coupled to the gate of N-channel MOSFET 524 and, through inverter 526, to the gate of N-channel MOSFET 530. Transistors 520 and 524 are coupled in series between node 132 and ground. Transistors 522 and 530 are coupled in series between node 134 and ground. When initialize signal INIT is high, transistors 520 and 522 are on. If clear/preset signal C/$\overline{P}$ is high, transistor 524 is on and transistor 530 is off. Node 132 is driven to 0 through transistors 520 and 524. If clear/preset signal C/$\overline{P}$ is low, transistor 524 is off and transistor 530 is on. Node 134 is driven to 0 through transistors 522 and 530.

When initialize signal INIT is low, transistors 520 and 522 are off and are thus inactive to drive nodes 132 and 134. Further, when initialize signal INIT is high, circuits 148 present a high impedance to nodes 132 and 134, and when initialize signal INIT is low, it does not affect the operation of edge-sensitive cells 144 which operation is then determined by reset signals R0 and R1 and by set signals S0 and S1. This is accomplished like in flip-flop 410 of FIG. 9. Namely, edge-sensitive cells 144 of flip-flop 510 are similar to edge-sensitive cells 144 of flip-flop 410. Cells 144 of flip-flop 510 are coupled to initialize input terminal 514 similarly to how cells 144a and 144b of flip-flop 410 are coupled to asynchronous set input terminal 414. The operation of edge-sensitive cells 144 of flip-flop 510 is thus similar to the operation of edge-sensitive cells 144 of flip-flop 410.

Some variations of flip-flop 220 of FIG. 3, flip-flops 310 of FIGS. 4 and 5, and flip-flop 410 of FIG. 9 are provided with a level-sensitive asynchronous initialization using circuitry similar to the circuitry of flip-flop 510.

While the invention has been described with respect to the embodiments set forth above, other embodiments and variations not described herein are within the scope of the invention. Variations of flip-flops 110, 220, 310, 410 and 510 have any number of reset input terminals, or have no reset input terminals. Some variations have any number of set input terminals, or have no set input terminals. Variations of flip-flop 310 have any number of trigger input terminals. Some variations of flip-flops 110, 220, 310, 410 and 510 are sensitive to a falling, as opposed to rising, edge of some or all set, reset and trigger input signals. Some variations are sensitive to both rising and falling edges of some or all input signals. Some variations are implemented using CMOS/NMOS technology. In other embodiments, PMOS technology is used. In particular, some or all of transistors 150, 152, 420, 422, 520, 522, 524 and 530 are PMOS transistors in some embodiments. In still other embodiments, bipolar technology is used. Ground is replaced by other sources of power in some embodiments. NAND-gate flip-flop 160 is replaced by other flip-flops. Other embodiments and variations not described herein are to be considered within the scope of the invention, as defined by the following claims.

What is claimed is:

1. An edge-triggered flip-flop adapted for assuming alternatively a first state or a second state, comprising:
   a first node having two states and adapted for being alternatively in a first one or a second one of its two states;
   means for setting a state of said flip-flop in accordance with a state of said first node;
   a plurality of first terminals;
   a plurality of first causing means for selectively causing said flip-flop to assume said first state of said flip-flop, each first causing means comprising:
   first driving means for selectively driving said first node, said first driving means having a first input and a second input, said first driving means being inactive to drive said first node when at least one of said first and second inputs of said first driving means is in its respective first state, said first driving means driving said first node to the first state of said first node when said first and second inputs of said first driving means are in their respective second states;
   first state means having a first input, said first state means having a second input having two states, said second input of said first state means being adapted for being alternatively in a first one or a second one of its two states, said first state means having an output, said first state means being for driving its output to a first state of said output of said first state means when said first input of said first state means is in a first state of said first input of said first state means and said second input of said first state means is in the second state of said second input of said first state means, said first state means driving its output to a second state of said output of said first state means when said first input of said first state means is in a second state of said first input of said first state means and said second input of said first state means undergoes a transition from the first state of said second input of said first state means to the second state of said second input of said first state means, the state of said output of said first state means remaining unchanged when said second input of said first state means is in the second state of said second input of said first state means and said first input of said first state means undergoes a transition from the first state of said first input of said first state means to the second state of said first input of said first state means;
   first coupling means for coupling said first input of said first driving means and said second input of said first state means to one of said first terminals; and means for coupling said output of said first state means to the second input of said first driving means; and means for coupling said first node to the first inputs of all said first state means.

2. The flip-flop of claim 1, wherein the first state means of each first causing means comprises an S-R flip-flop having a set input coupled to one of said first and second inputs of said first state means, a reset input coupled to the other one of said first and second inputs of said first state means, and an output coupled to the output of said first state means.

3. The flip-flop of claim 1 wherein the first state means of each first causing means comprises:
a first NAND gate having a first input coupled to the first input of said first state means; and
a second NAND gate having a first input coupled to an output of said first NAND gate, a second input coupled to the second input of said first state means, and an output coupled to a second input of said first NAND gate and to the output of said first state means.

4. An edge-triggered flip-flop adapted for assuming alternatively a first state or a second state, comprising:
a first node having two states and adapted for being alternatively in a first one or a second one of its two states;
means for setting a state of said flip-flop in accordance with a state of said first node;
at least one first terminal;
at least one first causing means for selectively causing said flip-flop to assume said first state of said flip-flop, each first causing means comprising:
first driving means for selectively driving said first node, said first driving means having a first input and a second input, said first driving means being inactive to drive said first node when at least one of said first and second inputs of said first driving means is in its respective first state, said first driving means driving said first node to the first state of said first node when said first and second inputs of said first driving means are in their respective second states;
first state means having a first input, said first state means having a second input having two states, said second input of said first state means being adapted for being alternatively in a first one or a second one of its two states, said first state means having an output, said first state means being for driving its output to a first state of said output of said first state means when said first input of said first state means is in a first state of said first input of said first state means and said second input of said first state means is in the second state of said second input of said first state means, said first state means driving its output to a second state of said output of said first state means when said first input of said first state means is in a second state of said first input of said first state means and said second input of said first state means undergoes a transition from the first state of said second input of said first state means to the second state of said second input of said first state means, the state of said output of said first state means remaining unchanged when said second input of said first state means is in the second state of said second input of said first state means and said first input of said first state means undergoes a transition from the first state of said first input of said first state means to the second state of said first input of said first state means;

first coupling means for coupling said first input of said first driving means and said second input of said first state means to one of said first terminals; and means for coupling said output of said first state means to the second input of said first driving means; and means for coupling said first node to the first inputs of all said first state means, wherein the first driving means of each first causing means comprises:
a first transistor having a first and a second electrode defining the ends of its main current carrying path and a control electrode for controlling the conductivity of said main current carrying path, said first electrode being directly connected to said first node, said control electrode being coupled to the first input of said first driving means;
a second transistor having a first and a second electrodes defining the ends of its main current carrying path and a control electrode for controlling the conductivity of said main current carrying path of said second transistor, said first electrode of said second transistor being coupled to said second electrode of said first transistor, said control electrode of said second transistor being coupled to the second input of said first driving means; and
means for coupling said second electrode of said second transistor to a source of power.

5. The flip-flop of claim 4, wherein said flip-flop state setting means comprises:
a first inverter having an input coupled to said first node and having an output coupled to an output of said flip-flop; and
a second inverter having an input coupled to said output of said first inverter and having an output coupled to said input of said first inverter.

6. The flip-flop of claim 1, wherein the first driving means of each first causing means comprises a first gate having a first input coupled to the first input of said first driving means, a second input coupled to the second input of said first driving means, and an output coupled to said first node.

7. The flip-flop of claim 6, wherein said flip-flop state setting means comprises a first flip-flop having an output coupled to said first node and having at least one input, all said inputs of said first flip-flop being set inputs of said first flip-flop or all said inputs of said first flip-flop being reset inputs of said first flip-flop, each of said inputs of said first flip-flop being coupled to the output of one of said first gates.

8. The flip-flop of claim 1, wherein said flip-flop state setting means comprises:
a first flip-flop having an output coupled to said first node and having at least one input, all said inputs of said first flip-flop being set inputs of said first flip-flop or all said inputs of said first flip-flop being reset inputs of said first flip-flop; and
wherein the first driving means of each first causing means has an output coupled to one of said inputs of said first flip-flop.

9. The flip-flop of claim 8 wherein said first flip-flop comprises a gate having an output coupled to said first node, each of said inputs of said first flip-flop being coupled to one input of said gate.

10. An edge-triggered flip-flop adapted for assuming alternatively a first state or a second state, comprising:
- a first node having two states and adapted for being alternatively in a first one or a second one of its two states;
- means for setting a state of said flip-flop in accordance with a state of said first node;
- at least one first terminal;
- at least one first causing means for selectively causing said flip-flop to assume said first state of said flip-flop, each first causing means comprising:
  - first driving means for selectively driving said first node, said first driving means having a first input and a second input, said first driving means being inactive to drive said first node when at least one of said first and second inputs of said first driving means is in its respective first state, said first driving means driving said first node to the first state of said first node when said first and second inputs of said first driving means are in their respective second states;
  - first state means having a first input, said first state means having a second input having two states, said second input of said first state means being adapted for being alternatively in a first one or a second one of its two states, said first state means having an output, said first state means being for driving its output to a first state of said output of said first state means when said first input of said first state means is in a first state of said first input of said first state means and said second input of said first state means is in the second state of said second input of said first state means, said first state means driving its output to a second state of said output of said first state means when said first input of said first state means is in a second state of said first input of said first state means and said second input of said first state means undergoes a transition from the first state of said second input of said first state means to the second state of said second input of said first state means, the state of said output of said first state means remaining unchanged when said second input of said first state means is in the second state of said second input of said first state means and said first input of said first state means undergoes a transition from the first state of said first input of said first state means to the second state of said first input of said first state means;
  - first coupling means for coupling said first input of said first driving means and said second input of said first state means to one of said first terminals; and
  - means for coupling said output of said first state means to the second input of said first driving means; and
  - means for coupling said first node to the first inputs of all said first state means,
  wherein, for at least one first causing means,
    the respective first terminal has a first state and a second state, said first terminal being adapted for being alternatively in a first one or a second one of its two states;
    the respective first coupling means comprises delaying means having an input coupled to the respective first terminal and an output coupled to the first input of the respective driving means, said delaying means being for providing a first delay between a transition of the respective first terminal from the first state of the respective first terminal to the second state of the respective first terminal and a transition of the first input of the respective first driving means from the first state of the first input of the respective first driving means to the second state of the first input of the respective first driving means; and
    the respective first coupling means and the respective first state means cooperate to provide a second delay, when said first node is in its first state, between a transition of the respective first terminal from the first state of the respective first terminal to the second state of the respective first terminal and a transition of the second input of the respective first driving means from the second state of the second input of the respective first driving means to the first state of the second input of the respective first driving means, said first delay being at least as long as said second delay.

11. The flip-flop of claim 10, wherein, for at least one first causing means having the delaying means,
- said delaying means provides a third delay between a transition of the respective first terminal from the second state of the respective first terminal to the first state of the respective first terminal and a transition of the first input of the respective first driving means from the second state of the first input of the respective first driving means to the first state of the first input of the respective first driving means; and
- the respective first coupling means and the respective first state means cooperate to provide a fourth delay between a transition of the respective first terminal from the second state of the respective first terminal to the first state of the respective first terminal and a transition of the second input of the respective first driving means from the first state of the second input of the respective first driving means to the second state of the second input of the respective first driving means, said fourth delay being at least as long as said third delay.

12. The flip-flop of claim 10, wherein at least one of the delaying means is a monostable multivibrator.

13. The flip-flop of claim 1, further comprising a second node having two states and adapted for being alternatively in a first one or a second one of its two states;
- wherein said flip-flop state setting means drives said flip-flop to the first state of said flip-flop when said first node is in its first state and said second node is in its second state, wherein said flip-flop state setting means drives said flip-flop to the second state of said flip-flop when said first node is in its second state and said second node is in its first state; and
- wherein said flip-flop further comprises:
  - at least one second terminal;
  - at least one second causing means for selectively causing said flip-flop to assume the second state of said flip-flop, each second causing means comprising:
    - second driving means for selectively driving said second node, said second causing means having a first input and a second input, said second causing means being inactive to drive said second node when at least one of said first and second inputs of said second causing means is in its respective first state, said second causing means driving said second node to the first state of said second node when said first and second inputs of said second causing means are in their respective second states;

second state means having a first input, said second state means having a second input having two states, said second input of said second state means being adapted for being alternatively in a first one or a second one of its two states, said second state means having an output, said second state means being for driving its output to a first state of said output of said second state means when said first input of said second state means is in a first state of said first input of said second state means and said second input of said second state means is in the second state of said second input of said second state means, said second state means driving its output to a second state of said output of said second state means when said first input of said second state means is in a second state of said first input of said second state means and said second input of said second state means undergoes a transition from the first state of said second input of said second state means to the second state of said second input of said second state means, the state of said output of said second state means remaining unchanged when said second input of said second state means is in the second state of said second input of said second state means and said first input of said second state means undergoes a transition from the first state of said first input of said second state means to the second state of said first input of said second state means;

second coupling means for coupling said first input of said second driving means and said second input of said second state means to one of said second terminals; and means for coupling said output of said second state means to the second input of said second driving means; and means for coupling said second node to the first inputs of all said second state means.

14. The flip-flop of claim 13, wherein said flip-flop state setting means comprises:
a first inverter having an input coupled to said first node and having an output coupled to said second node and to an output of said flip-flop; and
a second inverter having an input coupled to said second node and having an output coupled to said first node and to an output of said flip-flop.

15. The flip-flop of claim 13, wherein said flip-flop state setting means comprises a first flip-flop having a first output coupled to said first node, having a second output coupled to said second node, having at least one set input, each set input being coupled to an output of one of said first driving means, and having at least one reset input, each reset input being coupled to an output of one of said second driving means.

16. The flip-flop of claim 15, wherein said first flip-flop comprises:
a first gate having an output coupled to said first node and having at least one input coupled to one of said set inputs; and
a second gate having an output coupled to said second node and to an input of said first gate, having at least one input coupled to one of said reset inputs and having an input coupled to said output of said first gate.

17. An edge-triggered flip-flop adapted for assuming alternatively a first state or a second state, comprising:
a first node having two states and adapted for being alternatively in a first one or a second one of its two states;
means for setting a state of said flip-flop in accordance with a state of said first node;
at least one first terminal;
at least one first causing means for selectively causing said flip-flop to assume said first state of said flip-flop, each first causing means comprising:
first driving means for selectively driving said first node, said first driving means having a first input and a second input, said first driving means being inactive to drive said first node when at least one of said first and second inputs of said first driving means is in its respective first state, said first driving means driving said first node to the first state of said first node when said first and second inputs of said first driving means are in their respective second states;
first state means having a first input, said first state means having a second input having two states, said second input of said first state means being adapted for being alternatively in a first one or a second one of its two states, said first state means having an output, said first state means being for driving its output to a first state of said output of said first state means when said first input of said first state means is in a first state of said first input of said first state means and said second input of said first state means is in the second state of said second input of said first state means, said first state means driving its output to a second state of said output of said first state means when said first input of said first state means is in a second state of said first input of said first state means and said second input of said first state means undergoes a transition from the first state of said second input of said first state means to the second state of said second input of said first state means, the state of said output of said first state means remaining unchanged when said second input of said first state means is in the second state of said second input of said first state means and said first input of said first state means undergoes a transition from the first state of said first input of said first state means to the second state of said first input of said first state means;
first coupling means for coupling said first input of said first driving means and said second input of said first state means to one of said first terminals; and
means for coupling said output of said first state means to the second input of said first driving means;
means for coupling said first node to the first inputs of all said first state means; and
a second node having two states and adapted for being alternatively in a first one or a second one of its two states;
wherein said flip-flop state setting means drives said flip-flop to the first state of said flip-flop when said first node is in its first state and said second node is in its second state, wherein said flip-flop state setting means drives said flip-flop to the second state of said flip-flop when said first node is in its second state and said second node is in its first state; and
wherein said flip-flop further comprises:
  at least one second terminal;
  at least one second causing means for selectively causing said flip-flop to assume the second state of said flip-flop, each second causing means comprising:
    second driving means for selectively driving said second node, said second causing means having a first input and a second input, said second causing means being inactive to drive said second node when at least one of said first and second inputs of said second causing means is in its respective first state, said second causing means driving said second node to the first state of said second node when said first and second inputs of said second causing means are in their respective second states;
    second state means having a first input, said second state means having a second input having two states, said second input of said second state means being adapted for being alternatively in a first one or a second one of its two states, said second state means having an output, said second state means being for driving its output to a first state of said output of said second state means when said first input of said second state means is in a first state of said first input of said second state means and said second input of said second state means is in the second state of said second input of said second state means, said second state means driving its output to a second state of said output of said second state means when said first input of said second state means is in a second state of said first input of said second state means and said second input of said second state means undergoes a transition from the first state of said second input of said second state means to the second state of said second input of said second state means, the state of said output of said second state means remaining unchanged when said second input of said second state means is in the second state of said second input of said second state means and said first input of said second state means undergoes a transition from the first state of said first input of said second state means to the second state of said first input of said second state means;
    second coupling means for coupling said first input of said second driving means and said second input of said second state means to one of said second terminals; and
    means for coupling said output of said second state means to the second input of said second driving means;
  means for coupling said second node to the first inputs of all said second state means; and
  means for coupling at least one selected pair of one of said first terminals and one of said second terminals to each other.

18. An edge-triggered flip-flop adapted for assuming alternatively a first state or a second state, comprising:
  a first node having two states and adapted for being alternatively in a first one or a second one of its two states;
  means for setting a state of said flip-flop in accordance with a state of said first node;
  at least one first terminal;
  at least one first causing means for selectively causing said flip-flop to assume said first state of said flip-flop, each first causing means comprising:
    first driving means for selectively driving said first node, said first driving means having a first input and a second input, said first driving means being inactive to drive said first node when at least one of said first and second inputs of said first driving means is in its respective first state, said first driving means driving said first node to the first state of said first node when said first and second inputs of said first driving means are in their respective second states;
    first state means having a first input, said first state means having a second input having two states, said second input of said first state means being adapted for being alternatively in a first one or a second one of its two states, said first state means having an output, said first state means being for driving its output to a first state of said output of said first state means when said first input of said first state means is in a first state of said first input of said first state means and said second input of said first state means is in the second state of said second input of said first state means, said first state means driving its output to a second state of said output of said first state means when said first input of said first state means is in a second state of said first input of said first state means and said second input of said first state means undergoes a transition from the first state of said second input of said first state means to the second state of said second input of said first state means, the state of said output of said first state means remaining unchanged when said second input of said first state means is in the second state of said second input of said first state means and said first input of said first state means undergoes a transition from the first state of said first input of said first state means to the second state of said first input of said first state means;
    first coupling means for coupling said first input of said first driving means and said second input of said first state means to one of said first terminals; and
    means for coupling said output of said first state means to the second input of said first driving means;
  means for coupling said first node to the first inputs of all said first state means; and
  a second node having two states and adapted for being alternatively in a first one or a second one of its two states;
  wherein said flip-flop state setting means drives said flip-flop to the first state of said flip-flop when said first node is in its first state and said second node is in its second state, wherein said flip-flop state setting means drives said flip-flop to the second state of said flip-flop when said first node is in its second state and said second node is in its first state; and
  wherein said flip-flop further compries:
    at least one second terminal;
    at least one second causing means for selectively causing said flip-flop to assume the second state of said flip-flop, each second causing means comprising:

second driving means for selectively driving said second node, said second causing means having a first input and a second input, sad second causing means being inactive to drive said second node when at least one of said first and second inputs of said second causing means is in its respective first state, said second causing means driving said second node to the first state of said second node when said first and second inputs of said second causing means are in their receptive second states;

second state means having a first input, said second state means having a second input having two states, said second input of said second state means being adapted for being alternatively in a first one or a second one of its two states, said second state means having an output, said second state means being for driving its output to a first state of said output of said second state means when said first input of said second state means is in a first state of said first input of said second state means and said second input of said second state means is in the second state of said second input of said second state means, said second state means driving its output to a second state of said output of said second state means when said first input of said second state means is in a second state of said first input of said second state means and said second input of said second state means undergoes a transition from the first state of said second input of said second state means to the second state of said second input of said second state means, the state of said output of said second state means remaining unchanged when said second input of said second state means is in the second state of said second input of said second state means and said first input of said second state means undergoes a transition from the first state of said first input of said second state means to the second state of said first input of said second state means;

second coupling means for coupling said first input of said second driving means and said second input of said second state means to one of said second terminals; and means for coupling said output of said second state means to the second input of said second driving means;

means for coupling said second node to the first input of all said second state means;

a third terminal having two states and adapted for being alternatively in a first one or a second one of its two state, wherein, for one of said first causing means, the respective first terminal is coupled to said third terminal;

the respective first coupling means comprises delaying means having an input coupled to the respective first terminal and an output coupled to the first input of the respective first driving means, said delaying means being for providing a first delay on a transition of said third terminal from the first state of said third terminal to the second state of said third terminal; and the respective first state means provides a second delay, when said fist node is in its first state, on a transition of said third terminal from the first state of said third terminal to the second state of said third terminal, said first delay being at least as long as said second delay; and wherein, for one of said second causing means, the respective second terminal is coupled to said third terminal;

the respective second coupling means comprises said delaying means, the input of said delaying means being coupled to the respective second terminal, the output of said delaying means being coupled to the first input of the respective second driving means; and the respective second state means provides a third delay, when said second node is in its first state, on a transition of said third terminal from the first state of said third terminal to the second state of said third terminal, said first delay being at least as long as said third delay.

19. The flip-flop of claim 1 wherein said delaying means provides a fourth delay on a transition of said third terminal from the second state of said third terminal to the first state of said third terminal;

the respective first state means provides a fifth delay on a transition of said third terminal from the second state of said third terminal to the first state of said third terminal, said fifth delay being at least as long as said fourth delay; and the respective second state means provides a sixth delay on a transition of said third terminal from the second state of terminal to the first state of said third terminal, said sixth delay being at least as long as said fourth delay.

20. The flip-flop of claim 1, wherein said delaying means is a monostable multivibrator.

21. The flip-flop of claim 1, further comprising:

a second terminal having two states and adapted for being alternatively in a first one or a second one of its two states;

second driving means for driving said first node to the second state of said first node when said second terminal is in its second state, said second driving means being inactive to drive said first node when said second terminal is in its first state; and second causing means for causing all the first driving means to be inactive to drive said first node when said second terminal is in its second state 22. The flip-flop of claim 21, wherein the first state means of each first causing means comprises:

a first gate having a first input coupled to the first input of said first state means and having a second input, a third input and an output;

a second gate having a first input coupled to said output of said first gate, an output coupled to said third input of said first gate and to the output of said first state means, and having a second input; and a third gate having a first input coupled to the second input of said first state means, an output coupled to said second input of said second gate, and having a second input; and wherein said second causing means further comprises:

means for coupling said second terminal to the second inputs of all the first gates; and means for coupling said second terminal to the second inputs of all the third gates.

23. The flip-flop of claim 10, further comprising:
a second terminal having two states and adapted for being alternatively in the first one or a second one of its two states;
second driving means for driving said first node to the second state of said first node when said second terminal is in its second state, said second driving means being inactive to drive said first node when said second terminal is in its first state; and
second causing means for causing all the first driving means to be inactive to drive said first node when said second terminal is in its second state.

24. The flip-flop of claim 13, further comprising:
a third terminal having two states and adapted for being alternatively in a first one or a second one of its two states;
third driving means for driving said second node to the first state of said second node when said third terminal is in its second state, said third driving means causing all the first driving means to be inactive to drive said first node when said third terminal is in its second state, said third driving means being inactive to drive said second node when said third terminal is in its first state;
a fourth terminal having two states and adapted for being in a first one or a second one of its two states; and
fourth driving means for driving said first node to the first state of said first node when said fourth terminal is in its second state, said fourth driving means causing all the second driving means to be inactive to drive said second node when said fourth terminal is in its second state, said fourth driving means being inactive to drive said first node when said fourth terminal is in its first state.

25. The flip-flop of claim 1, further comprising:
a fourth terminal having two states and adapted for being alternatively in a first one or a second one of its two states;
third driving means for driving said second node to the first state of said second node when said fourth terminal is in its second state, said third driving means causing all the first driving means to be inactive to drive said first node when said fourth terminal is in its second state, said third driving means being inactive to drive said second node when said fourth terminal is in its first state;
a fifth terminal having two states and adapted for being in a first one or a second one of its two states; and
fourth driving means for driving said first node to the first state of said first node when said fifth terminal is in its second state, said fourth driving means causing all the second driving means to be inactive to drive said second node when said fifth terminal is in its second state, said fourth driving means being inactive to drive said first node when said fifth terminal is in its first state.

26. The flip-flop of claim 1, further comprising:
a second terminal having two states and adapted for being alternatively in a first one or a second one of its two states;
a third terminal having two states and adapted for being alternatively in a first one or a second one of its two states;
second driving means for driving said first node to the second state of said first node when said second terminal is in its second state and said third terminal is in its first state, said second driving means driving said first node to the first state of said first node when said second terminal is in its second state and said third terminal is in its second state, said second driving means being inactive to drive said first node when said second terminal is in its first state; and
second causing means for causing all the first driving means to be inactive to drive said first node when said second terminal is in its second state.

27. The flip-flop of claim 26, wherein the first state means of each first causing means comprises:
a first gate having a first input coupled to the first input of said first state means and having a second input, a third input and an output;
a second gate having a first input coupled to said output of said first gate, an output coupled to said third input of said first gate and to the output of said first state means, and having a second input; and
a third gate having a first input coupled to the second input of said first state means, an output coupled to said second input of said second gate, and having a second input; and wherein said second causing means further comprises:
means for coupling said second terminal to the second inputs of all the first gates; and
means for coupling said second terminal to the second inputs of all the third gates.

28. The flip-flop of claim 13, further comprising:
a third terminal having two states and adapted for being alternatively in a first one or a second one of its two states;
a fourth terminal having two states and adapted for being alternatively in a first one or a second one of its two states; and
third driving means for driving said second node to the first state of said second node when said third terminal is in its second state and said fourth terminal is in its first state, said third driving means driving said first node to the first state of said first node when said third terminal is in its second state and said fourth terminal is in its second state, said third driving means causing all the first driving means to be inactive to drive said first node and all the second driving means to be inactive to drive said second node when said third terminal is in its second state, said third driving means being inactive to drive said first and second nodes when said third terminal is in its first state.

29. An edge-triggered Set/Reset flip-flop comprising:
a data latch having terminals L and L-complement;
a first edge-sensitive cell comprising:
cross-coupled first and second NAND gates, said first NAND gate having a second input connected to L, and said second NAND gate having a second input connected to a first input I1; and
first and second switches connected to L for selectively forcing the state of said latch, said first switch being controlled by i1 and said second switch being controlled by an output of said second NAND gate;
a second edge-sensitive cell comprising:
cross-coupled third and fourth NAND gates, said third NAND gate having a second input connected to L-complement, and said fourth NAND gate having a second input connected to a second input I2; and third and fourth switches connected to L-complement for selectively forcing the state of said latch, said third switch being controlled by I2 and said fourth switch being controlled by an output of said fourth NAND gate; and a third edge-sensitive cell comprising:

cross-coupled fifth and sixth NAND gates, said fifth NAND gate having a second input connected to L, and said sixth NAND gate having a second input connected to a third input I3; and fifth and sixth switches connected to L for selectively forcing the state of said latch, said fifth switch being controlled by I3 and said sixth switch being controlled by an output of said sixth NAND gate.

* * * * *

UNITED STATES PATENT AND TRADEMARK OFFICE
CERTIFICATE OF CORRECTION

PATENT NO. : 5,124,568
DATED : June 23, 1992
INVENTOR(S) : Chen et al.

It is certified that error appears in the above-identified patent and that said Letters Patent is hereby corrected as shown below:

Col. 19, line 5 (Claim 18), delete "sad" and insert --said--.

Signed and Sealed this

Twenty-first Day of September, 1993

Attest:

BRUCE LEHMAN

Attesting Officer    Commissioner of Patents and Trademarks